United States Patent [19]

Fuccello, Sr. et al.

[11] Patent Number: 4,759,829

[45] Date of Patent: Jul. 26, 1988

[54] DEVICE HEADER AND METHOD OF MAKING SAME

[75] Inventors: Frank J. Fuccello, Sr.; Frank Z. Hawrylo, both of Trenton; Robert E. Harwood, Princeton, all of N.J.

[73] Assignee: RCA Corporation, Princeton, N.J.

[21] Appl. No.: 108,664

[22] Filed: Oct. 15, 1987

Related U.S. Application Data

[62] Division of Ser. No. 749,269, Jun. 27, 1985.

[51] Int. Cl.⁴ .............................................. C25D 5/02
[52] U.S. Cl. ................................. 204/15; 204/38.4; 204/38.5
[58] Field of Search .................. 204/15, 32.1, 38.1, 204/38.4, 38.5

[56] References Cited

U.S. PATENT DOCUMENTS

| | | | |
|---|---|---|---|
| 3,828,425 | 8/1974 | Manus | 357/67 |
| 3,860,949 | 1/1975 | Stoeckert et al. | 357/79 |
| 3,869,702 | 3/1975 | Backhouse et al. | 357/74 |
| 4,394,679 | 7/1983 | Hawrylo | 357/81 |

FOREIGN PATENT DOCUMENTS 0001858  1/1978  Japan ..................................... 357/67

Primary Examiner—T. M. Tufariello
Attorney, Agent, or Firm—Theodore R. Furman

[57] ABSTRACT

A device header with a multilayer coating overlying its entire surface, and a method of making said header, are disclosed. The multilayer coating comprises an electrolytic nickel layer and a gold layer in the device mounting area of the header, whereas the rest of the header is coated with electroless nickel, a first gold layer, electrolytic nickel, and a second gold layer. In the fabrication, the electroless nickel layer is deposited over the entire header followed by the first gold layer. Upon removing these layers from the device mounting area, the first gold layer remaining on the rest of the header acts as a mask for the etching of the mounting area preparatory to deposition of electrolytic nickel and the second gold layer. The header has the advantage of the excellent coverage of electroless nickel over most of its surface, but with the advantage of high purity electrolytic nickel in the device mounting area.

8 Claims, 1 Drawing Sheet

DEVICE HEADER AND METHOD OF MAKING SAME

The Government has rights in this invention pursuant to a Government Contract.

This invention relates to an improved header suitable for use with semiconductor devices and, in particular, to a header with a multilayer coating overlying its entire surface and a method for fabrication of such a header.

BACKGROUND OF THE INVENTION

Semiconductor devices are typically fabricated by attaching the device, e.g. a light emitting element or laser, to a mount or header. A header comprises a base plate with two major surfaces and a heatsink affixed to one of the major surfaces. The heatsink is usually of a good thermal conductor-like copper and has a device mounting area to which the device can be soldered or bonded. The header may also include a stud, pins, or the like on the other major surface suitable for mounting the header onto an external support.

It is known to metallize the header, e.g. with nickel and gold, prior to bonding the light emitting element thereto. Electroless nickel is widely used because of the excellent coverage it is known to provide on the intricately shaped headers. Further, deposition of electroless nickel is convenient on a variety of base metals with minimal surface preparation. The nickel layer acts as a barrier to prevent any diffusion of copper into the light emitting device. The electroless nickel layer is usually followed with a layer of gold. The gold is a protective layer with good conductivity which also enhances solderability of the device.

There are problems, however, in using the electroless nickel for the above application. First, the most convenient-to-deposit forms of electroless nickel contain a certain amount of phosphorus. When the mounting area of the copper heatsink is heated during the process of soldering the light emitting device thereto, the phosphorus migrates to the surface forming detrimental intermetallic compounds with the solder. These intermetallic compounds can adversely affect the thermal and electrical conductivity, as well as the physical strength, of the solder bond.

Also, it is desirable to have a sharp edge on the copper heatsink terminating the mounting area. Because of its excellent coverage characteristics, an electroless nickel layer tends to be somewhat nonconformal and thereby rounding off and compromising the sharpness of the edge of the heatsink.

It is known that the nickel deposited by an electrolytic process is more conformal and of the highest purity. Unfortunately, the electrolytic nickel solution does not "throw" into all of the contours and crevices of the header as well as the electroless nickel solution does. Therefore, it is harder to get an overall coverage on the header using electrolytic nickel. Further, the copper heatsink should be treated in a nitric-sulfuric etch solution preparatory to deposition with electrolytic nickel. This solution is known to attack the steel base plate and stud of the header.

Attempts to selectively etch the copper by masking the steel parts with waxes, photoresists and the like have proven to be impractical for production purposes. Applying, delineating, and removing mask materials from large numbers of headers is a highly tedious task. Further, many masking materials leave an organic residue on the metal parts detrimental to subsequent plating.

It would be desirable therefore, to have a device header which could combine the advantages provided by the electroless and electrolytic nickel processes and a method for fabricating such a header.

SUMMARY OF THE INVENTION

A device header with a multilayer coating overlying its entire surface, and a method of making said header, are disclosed. The multilayer coating comprises an electrolytic nickel layer and a gold layer in the device mounting area of the header, whereas the rest of the header is coated with electroless nickel, a first gold layer, electrolytic nickel, and a second gold layer. In the fabrication, the electroless nickel layer is deposited over the entire header followed by the first gold layer. Upon removing these layers from the device mounting area, the first gold layer remaining on the rest of the header acts as a mask for the etching of the mounting area preparatory to deposition of electrolytic nickel and the second gold layer. The header has the advantage of the excellent coverage of electroless nickel over most of its surface, but with the advantage of high purity electrolytic nickel in the device mounting area.

DETAILED DESCRIPTION OF PREFERRED EMBODIMENTS

Figure 1:
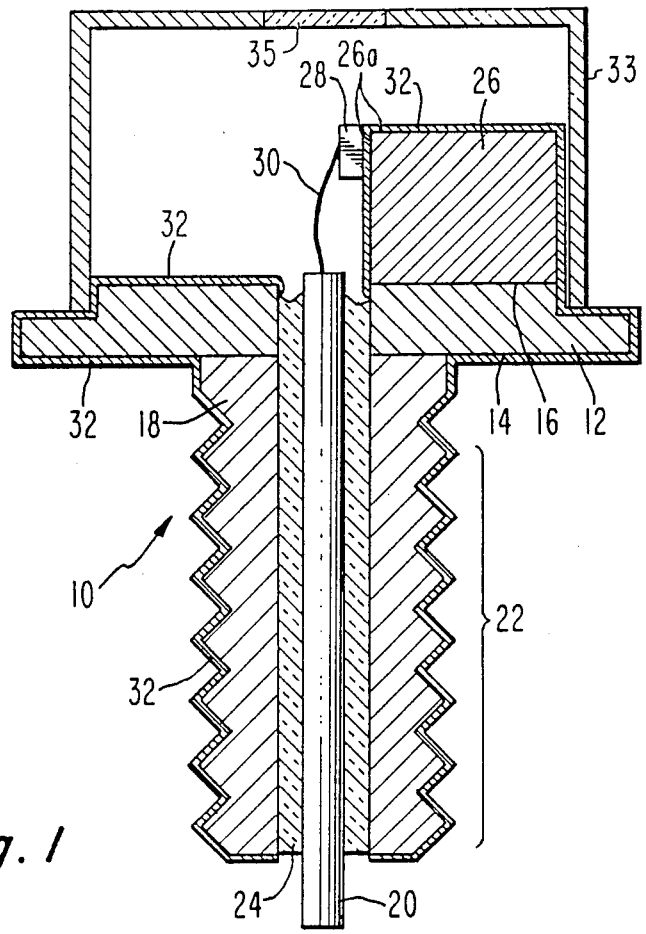
FIG. 1 is a cross-sectional view of a light emitting device mounted on a header of the present invention.

The present invention will be described with reference to a stud-type header, although the invention is equally applicable to any type of device header. Referring to FIG. 1, the device header 10 comprises a base plate 12 having first and second major surfaces 14 and 16 with a mounting stud 18 mounted on the first major surface 14. The mounting stud 18 has an electrical lead 20 extending axially through an opening in the base plate 12 and a threaded portion 22 suitable for mounting on an external support. The base plate 12 and stud 18 are typically of steel. The electrical lead 20 is isolated from the mounting stud 18 by an electrically insulating material 24 such as a glass or plastic encapsulant. A copper or copper alloy heatsink 26, with a device mounting area 26a, is mounted on the second major surface 16 and a light emitting device 28 is mounted on the heatsink 26. One typical copper alloy comprises about 0.5 percent tellurium and the balance substantially copper. An electrical wire 30 connects the electrical lead 20 to one side of the light emitting device 28 with the second electrical contact to the light emitting device 28 being made through the base plate 12 and the stud 18. A multilayer coating 32 overlies the surfaces of the base plate 12 and the outer surface of the mounting stud 18 including the threaded portion 22. A cover 33 with a light transmissive window 35 mounted therein is attached to the second major surface 16 and encloses the light emitting device 28. The window 35 is so positioned in the cover 33 that a light beam emitted by the device 28 will pass through the window 35.

Figure 2:
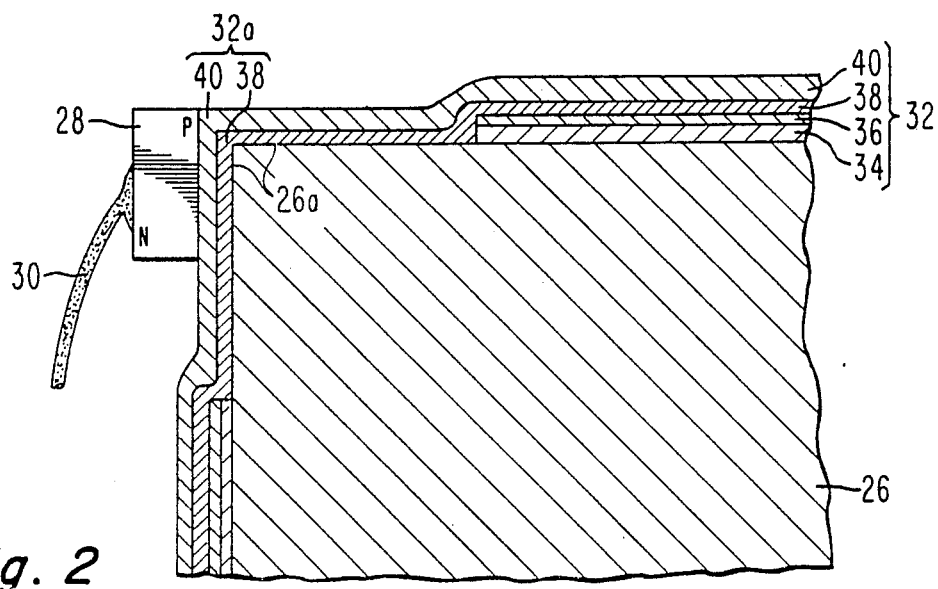
FIG. 2 is an enlarged cross-sectional view of the device mounting area of FIG. 1 illustrating an embodiment of the multilayer coating of the present invention.

FIG. 2 is an enlarged view of the heatsink 26 and the device mounting area 26a which shows the various layers which make up the multilayer coating 32. A layer of electroless nickel 34 overlies the entire header except the device mounting area 26a. The electroless nickel layer 34 can be of any desired thickness but at a minimum should be of a thickness to provide complete coverage of all surfaces of the base plate 12, stud 18 and heatsink 26. A first gold layer 36 overlies the electroless nickel layer 34. The first gold layer 36 can be deposited by any convenient method, e.g. electrolytic plating, electroless deposition, evaporation, sputtering and the like. The first gold layer 36 should be of a sufficient thickness to act as a protective mask during chemical etching of the device mounting area 26a. Between 1.0 and 3.0 micrometers ($\mu$m) of electrolytically deposited gold are suitable for this purpose.

A layer of electrolytic nickel 38 overlies the device mounting area 26a and the first gold layer 36 over the rest of the heatsink 26, base plate 12, and stud 18. The electrolytic nickel layer 38 should be of a high purity nickel and should be of a thickness sufficient to prevent diffusion of copper from the heatsink 26 to the light emitting device 28. Thicknesses of 0.5 to 5.0 $\mu$m are suitable for this purpose with an electrolytic nickel layer 38 about 1.5 to 2.5 $\mu$m in thickness being preferred.

Overlying the electrolytic nickel layer 38 is a second gold layer 40 which, as the first gold layer 36, can be deposited by any convenient means. The second gold layer 40 is a protective layer for the unit and also allows for convenient bonding of the light emitting device 28. Therefore, the thickness of the second gold layer 40 should be in accordance with a desired bonding or soldering technique. For thermocompression bonding of the light emitting device 28 to the heatsink 26 thicknesses for the second gold layer 40 from about 2.0 $\mu$m to 10 $\mu$m have been found suitable with 4.0 to 6.0 $\mu$m being preferred.

Thus, the coating 32 over the heatsink 26, base plate 12 and stud 18 comprises the electroless nickel layer 34, the first gold layer 36, the electrolytic nickel layer 38 and the second gold layer 40, whereas the device mounting area 26a is covered with a coating 32a, unique to that area, which comprises only the electrolytic nickel layer 38 and the second gold layer 40.

The method of the present invention will now be described. The stud 18 and heatsink 26 can be affixed to the base plate 12 by known welding or brazing techniques. To prepare the header for the electroless nickel layer 34, the header can be treated in solvents and alkaline cleaners. Since bright dips for copper are known to attack steel, they should not be used here so as to avoid damage to the base plate 12 and stud 18. After depositing the electroless nickel layer 34, the first gold layer 36 can be deposited thereover. Initially, these two layers 34, 36 cover the entire base plate 12, stud 18 and heatsink 26, including the device mounting area 26a.

At this point the electroless nickel layer 34 and the first gold layer 36 are removed from the device mounting area 26a. These layers 34, 36 can be removed by physical or mechanical means e.g. machining, cutting, milling and the like. R. E. Harwood et al., in copending application Ser. No. 735,163, describe a cutting apparatus suitable for imparting a sharp corner to the edge of a heatsink. This can be accomplished while removing the electroless nickel layer 34 and the first gold layer 36.

After removing these two layers 34 and 36, the exposed copper in the device mounting area 26a can be suitably bright dipped. Any copper etchant can be used, e.g. a solution comprising about 60 to 70 percent by volume of nitric acid and about 30 to 40 percent by volume of sulfuric acid. This type of a bright dip step is known in the art as a necessary procedure for proper adhesion of electrolytic nickel to copper and especially to copper alloys. Although this etchant is known to attack steel, the first gold layer 36 acts as a protective mask for the base plate 12 and stud 18 so that the device mounting area 26a can be selectively etched.

The next step is to deposit the electrolytic nickel layer 38 which will cover the device mounting area 26a and, further, will overlie the first gold layer 36 on the rest of the header. The electrolytic nickel layer 38 is a highly pure, conformal layer which will maintain the sharp corner imparted to the device mounting area 26a and will prevent phosphorus contamination during subsequent bonding.

The electrolytic nickel layer 38 is followed by a second gold layer 40 which covers the entire header 10. The light emitting device 28 can be soldered or bonded to the second gold layer 40 in the device mounting area 26a by means known in the art.

The advantage of such a header 10 is that the excellent coverage qualities of the electroless nickel layer 34 are provided where necessary, i.e. over the intricate shape of the header in toto, whereas the high purity, highly conformal qualities of the electrolytic nickel layer 38 provide excellent conditions for bonding the light emitting device 28 to the device mounting area 26a.

We claim:

1. A method for fabricating a header which includes a steel base plate with a copper or copper alloy heatsink affixed to a major surface of said base plate, said heatsink having a device mounting area thereon, said method comprising depositing electroless nickel onto the entire header;
depositing a first layer of gold over said electroless nickel;
removing said electroless nickel layer and said first gold layer in the device mounting area;
chemically cleaning the exposed copper or copper alloy of said device mounting area;
depositing electrolytic nickel onto the entire header; and,
depositing a second layer of gold over the electrolytic nickel.

2. The method of claim 1 wherein the exposed copper or copper alloy of said device mounting area is cleaned with a solution comprising from about 60 to 70 percent by volume of nitric acid and from about 30 to 40 percent by volume of sulfuric acid.

3. The method of claim 1 wherein said layer of electrolytic nickel is of a thickness sufficient to prevent diffusion of the copper or copper alloy therethrough.

4. The method of claim 3 wherein said layer of electrolytic nickel is from about 0.5 micrometers to about 5.0 micrometers in thickness.

5. The method of claim 4 wherein said layer of electrolytic nickel is about 1.5 to 2.5 micrometers in thickness.

6. The method of claim 1 wherein said second layer of gold is of a thickness sufficient for subsequent device mounting.

7. The method of claim 6 wherein said second layer of gold is from about 2.0 micrometers to about 10 micrometers in thickness.

8. The method of claim 7 wherein said second layer of gold is about 4.0 to 6.0 micrometers in thickness.

* * * * *